(12) United States Patent
Hosseini et al.

(10) Patent No.: US 9,048,338 B2
(45) Date of Patent: Jun. 2, 2015

(54) DEVICE INCLUDING TWO POWER SEMICONDUCTOR CHIPS AND MANUFACTURING THEREOF

(75) Inventors: Khalil Hosseini, Weihmichl (DE); Manfred Mengel, Bad Abbach (DE); Joachim Mahler, Regensburg (DE); Franz-Peter Kalz, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 693 days.

(21) Appl. No.: 13/289,667

(22) Filed: Nov. 4, 2011

(65) Prior Publication Data

US 2013/0113114 A1 May 9, 2013

(51) Int. Cl.
*H01L 21/00* (2006.01)
*H01L 23/00* (2006.01)
*H01L 23/495* (2006.01)
*H01L 23/051* (2006.01)
*H01L 23/31* (2006.01)

(52) U.S. Cl.
CPC ............... *H01L 24/83* (2013.01); *H01L 23/051* (2013.01); *H01L 23/3107* (2013.01); *H01L 23/49551* (2013.01); *H01L 23/49562* (2013.01); *H01L 23/49575* (2013.01); *H01L 24/33* (2013.01); *H01L 2224/32245* (2013.01); *H01L 2924/13091* (2013.01); *H01L 2924/01327* (2013.01); *H01L 2924/13055* (2013.01); *H01L 2224/0603* (2013.01); *H01L 2224/33181* (2013.01); *H01L 2224/83801* (2013.01); *H01L 2224/8382* (2013.01); *H01L 2224/8384* (2013.01); *H01L 2224/8385* (2013.01); *H01L 2924/13062* (2013.01); *H01L 2924/1306* (2013.01); *H01L 2924/1461* (2013.01); *H01L 2924/1305* (2013.01)

(58) Field of Classification Search
CPC ... H01L 24/83; H01L 24/33; H01L 23/49575; H01L 23/4955; H01L 23/49562; H01L 2924/1305
See application file for complete search history.

(56) References Cited

U.S. PATENT DOCUMENTS

| | | | | |
|---|---|---|---|---|
| 6,677,669 | B2 * | 1/2004 | Standing | 257/685 |
| 7,053,474 | B2 * | 5/2006 | Otremba | 257/685 |
| 7,271,470 | B1 | 9/2007 | Otremba | |
| 7,569,920 | B2 | 8/2009 | Otremba et al. | |
| 7,615,854 | B2 * | 11/2009 | Montgomery | 257/678 |
| 7,800,208 | B2 | 9/2010 | Otremba | |
| 7,800,217 | B2 * | 9/2010 | Otremba et al. | 257/700 |
| 7,955,954 | B2 * | 6/2011 | Landau et al. | 438/464 |
| 8,358,014 | B2 * | 1/2013 | Koduri | 257/777 |
| 8,436,429 | B2 * | 5/2013 | Xue et al. | 257/401 |
| 8,451,621 | B2 * | 5/2013 | Krishnan et al. | 361/790 |
| 2010/0301496 | A1 * | 12/2010 | Koduri | 257/777 |

\* cited by examiner

*Primary Examiner* — Laura Menz
(74) *Attorney, Agent, or Firm* — Slater & Matsil, L.L.P.

(57) ABSTRACT

A device includes a first power semiconductor chip having a first face and a second face opposite to the first face with a first contact pad arranged on the first face. The first contact pad is an external contact pad. The device further includes a first contact clip attached to the second face of the first power semiconductor chip. A second power semiconductor chip is attached to the first contact clip, and a second contact clip is attached to the second power semiconductor chip.

5 Claims, 10 Drawing Sheets

US 9,048,338 B2

DEVICE INCLUDING TWO POWER SEMICONDUCTOR CHIPS AND MANUFACTURING THEREOF

TECHNICAL FIELD

This invention relates to a device including two power semiconductor chips and a method of manufacturing thereof.

BACKGROUND

A power semiconductor chip is a specific type of semiconductor chip designed to handle significant power levels. Power semiconductor chips are suitable, in particular, for the switching and control of currents and/or voltages. They may be implemented as power MOSFETs, IGBTs, JFETs, power bipolar transistors or power diodes. Power semiconductor chips can be found in most power supplies, DC to DC converters and motor controllers. Power semiconductor chips may be stacked on top of each other for specific applications, such as half-bridge circuits.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION OF ILLUSTRATIVE EMBODIMENTS

Figure 1:
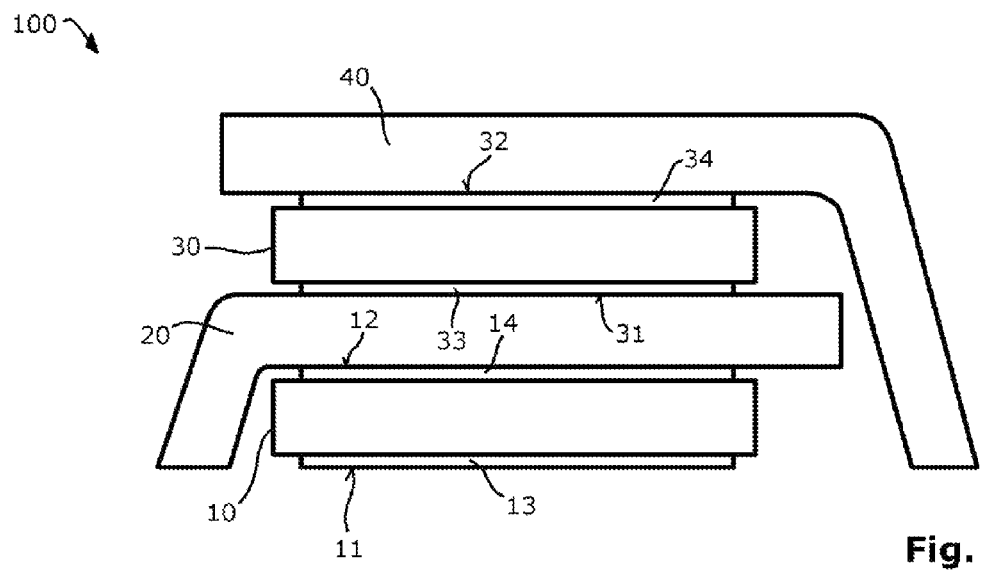
FIG. 1 schematically illustrates a cross-sectional view of one embodiment of a device including two power semiconductor chips stacked on each other.

In the following detailed description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

As employed in this specification, the terms "coupled" and/or "electrically coupled" are not meant to mean that the elements must be directly coupled together; intervening elements may be provided between the "coupled" or "electrically coupled" elements.

Devices containing one or more semiconductor chips are described below. The semiconductor chips may be of different types, may be manufactured by different technologies and may include, for example, integrated electrical, electro-optical or electro-mechanical circuits or passives. The integrated circuits may, for example, be designed as logic integrated circuits, analog integrated circuits, mixed signal integrated circuits, power integrated circuits, memory circuits or integrated passives. Furthermore, the semiconductor chips may be configured as so-called MEMS (micro-electro mechanical systems) and may include micro-mechanical structures, such as bridges, membranes or tongue structures. The semiconductor chips may be configured as sensors or actuators, for example, pressure sensors, acceleration sensors, rotation sensors, magnetic field sensors, electro-magnetic field sensors, microphones, etc. The semiconductor chips need not be manufactured from specific semiconductor material, for example, Si, SiC, SiGe, GaAs, and, furthermore, may contain inorganic and/or organic materials that are not semiconductors, such as, for example, insulators, plastics or metals. Moreover, the semiconductor chips may be packaged or unpackaged.

In particular, semiconductor chips having a vertical structure may be involved, that is to say that the semiconductor chips may be fabricated in such a way that electric currents can flow in a direction perpendicular to the main faces of the semiconductor chips. A semiconductor chip having a vertical structure has electrodes on its two main faces, that is to say on its top side and bottom side. In particular, power semiconductor chips may have a vertical structure and have load electrodes on both main faces. The vertical power semiconductor chips may, for example, be configured as power MOSFETs (Metal Oxide Semiconductor Field Effect Transistors), IGBTs (Insulated Gate Bipolar Transistors), JFETs (Junction Gate Field Effect Transistors), power bipolar transistors or power diodes. By way of example, the source electrode and gate electrode of a power MOSFET may be situated on one face, while the drain electrode of the power MOSFET is arranged on the other face. Furthermore, there are power MOSFETs which have their drain and gate electrodes on one face and the source electrode on the other face. In addition, the devices described below may include integrated circuits to control the integrated circuits of the power semiconductor chips.

The semiconductor chips have contact pads (or contact elements or terminals) which allow electrical contact to be made with the integrated circuits included in the semiconductor chips. The contact pads may include one or more metal layers that are applied to the semiconductor material. The metal layers may be manufactured with any desired geometric shape and any desired material composition. The metal layers may, for example, be in the form of a layer covering an area. Any desired metal or metal alloy, for example, aluminum, titanium, gold, silver, copper, palladium, platinum, nickel, chromium or nickel vanadium, may be used as the material. The metal layers need not be homogenous or manufactured from just one material, that is to say various compositions and concentrations of the materials contained in the metal layers are possible.

One or more contact clips may be used to electrically couple components to each other within the device or to couple contact pads of the semiconductor chips to external contact elements. Each of the contact clips has at least two contact areas, which are used to attach the contact clip to at least two components. The contact clips are manufactured from a metal or a metal alloy, in particular, copper, copper alloys, iron nickel or other appropriate electrically conductive materials.

The devices described below include external contact elements, which may be of any shape and size. The external contact elements are accessible from outside the device and thus allow electrical contact to be made with the semiconductor chips from outside the device. For this reason, the external contact elements have external contact surfaces which can be accessed from outside the device. Furthermore, the external contact elements may be thermally conductive and may serve as heat sinks for dissipating the heat generated by the semiconductor chips. The external contact elements are composed of any desired electrically conductive material, for example, of a metal, such as copper, aluminum or gold, a metal alloy or an electrically conductive organic material.

The devices may include an encapsulation material, for example, a mold material covering at least parts of the components of the devices. The mold material may be any appropriate thermoplastic or thermosetting material. Various techniques may be employed to cover the components with the mold material, for example, compression molding, injection molding, powder molding or liquid molding.

Each of the devices has a mounting surface. The mounting surface serves to mount the device onto another component, for example, a circuit board, such as a PCB (printed circuit board). External contact elements and, in particular, external contact surfaces may be disposed on the mounting surface to allow electrical coupling of the device to the component on which the device is mounted. Solder deposits, such as solder balls, or other appropriate connection elements may be used to establish an electrical and, in particular, mechanical connection between the device and the component on which the device is mounted.

FIG. 1 schematically illustrates a cross-sectional view of a device 100. The device 100 includes a first power semiconductor chip 10 with a first face 11 and a second face 12. A first contact pad 13 is arranged on the first face 11 and a second contact pad 14 is arranged on the second face 12 of the first power semiconductor chip 10. The first power semiconductor chip 10 is arranged such that the first contact pad 13 is exposed, i.e., the first contact pad 13 is accessible from outside the device 100 and serves as an external contact element. A first contact clip 20 is attached to the second face 12 of the first power semiconductor chip 10.

The device 100 further includes a second power semiconductor chip 30 with a first face 31 and a second face 32. A first contact pad 33 is arranged on the first face 31, and a second contact pad 34 is arranged on the second face 32 of the second power semiconductor chip 30. A second contact clip 40 is attached to the second face 32 of the second power semiconductor chip 30.

Figure 2A:
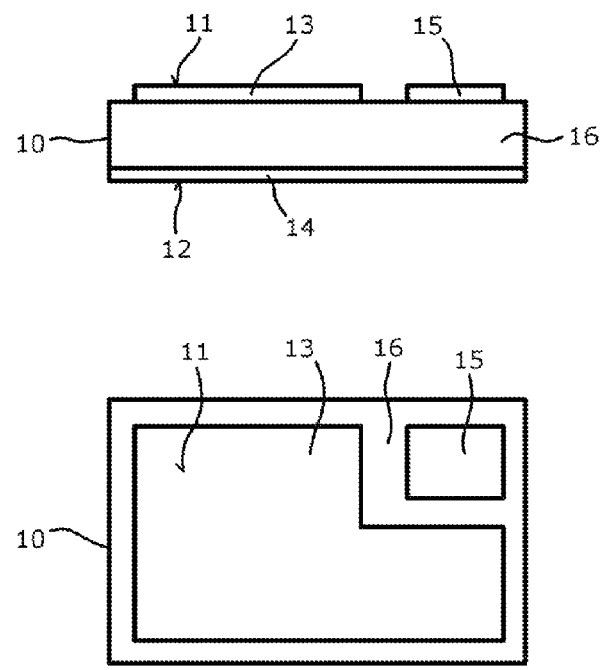
FIGS. 2A-2E schematically illustrate a cross-sectional and top plan view of one embodiment of a method including mounting two power semiconductor chips and two contact clips on top of each other, wherein both power semiconductor chips have source and gate contact pads on one face and a drain contact pad on the other face.
Figure 2B:
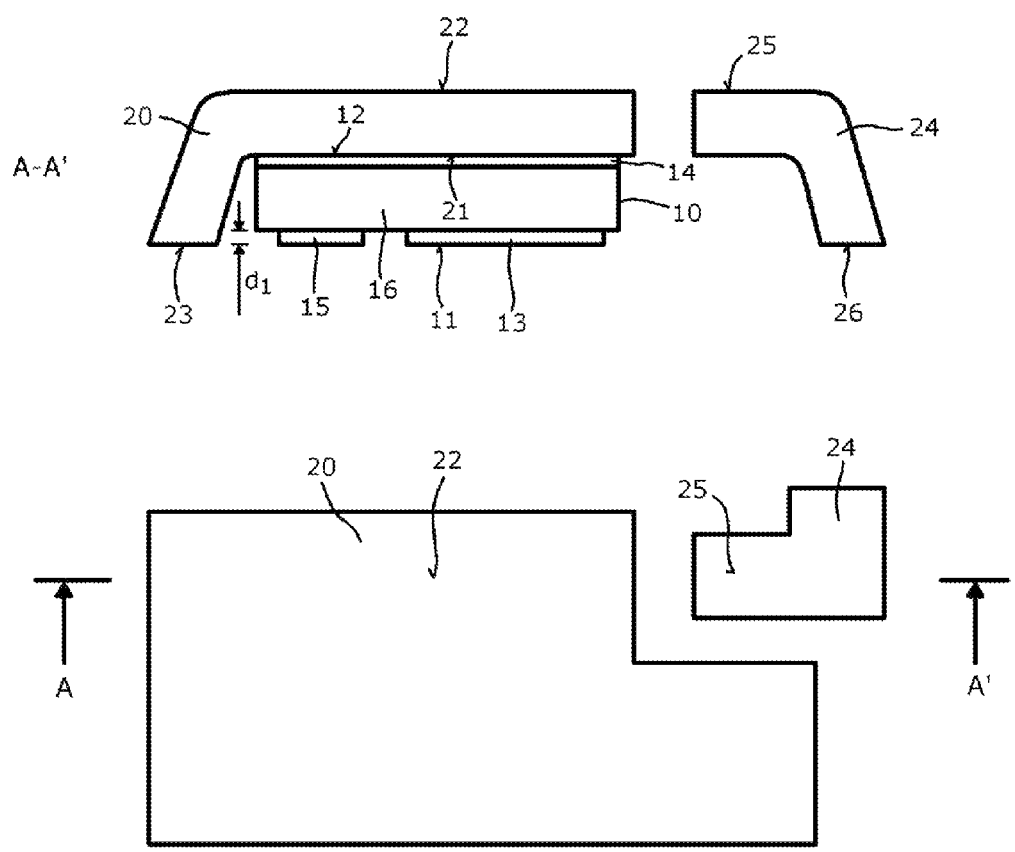
Figure 2C:
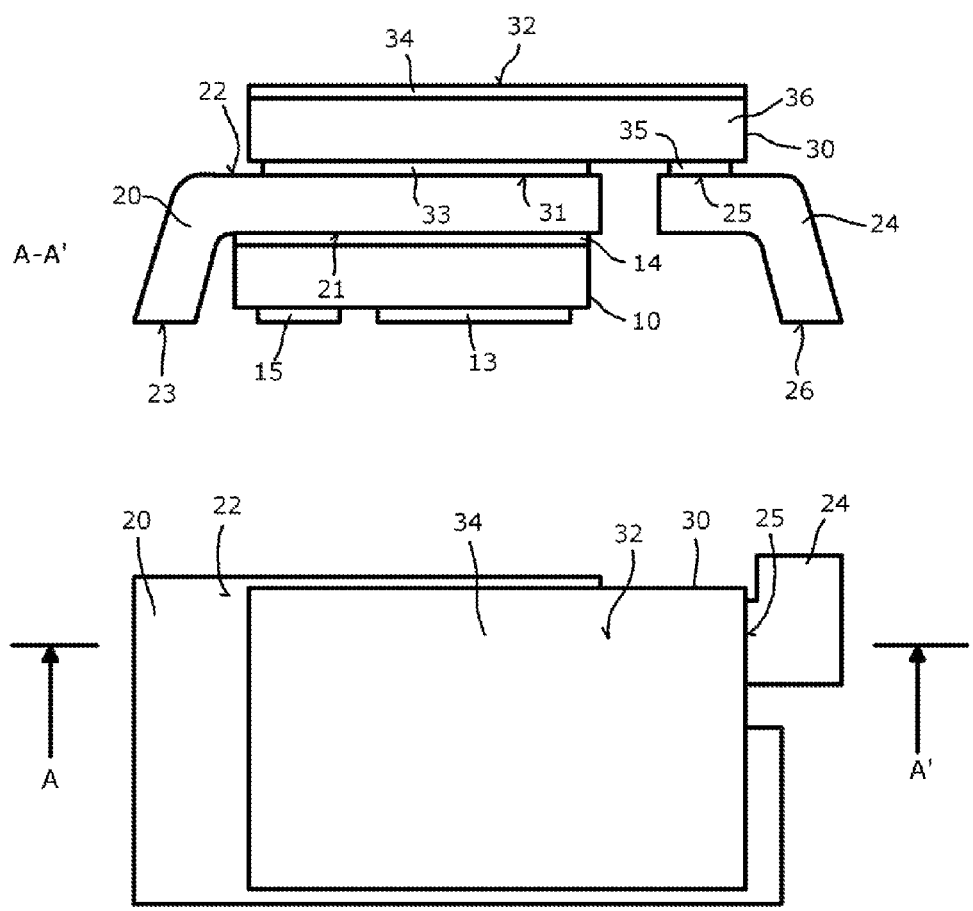
Figure 2D:
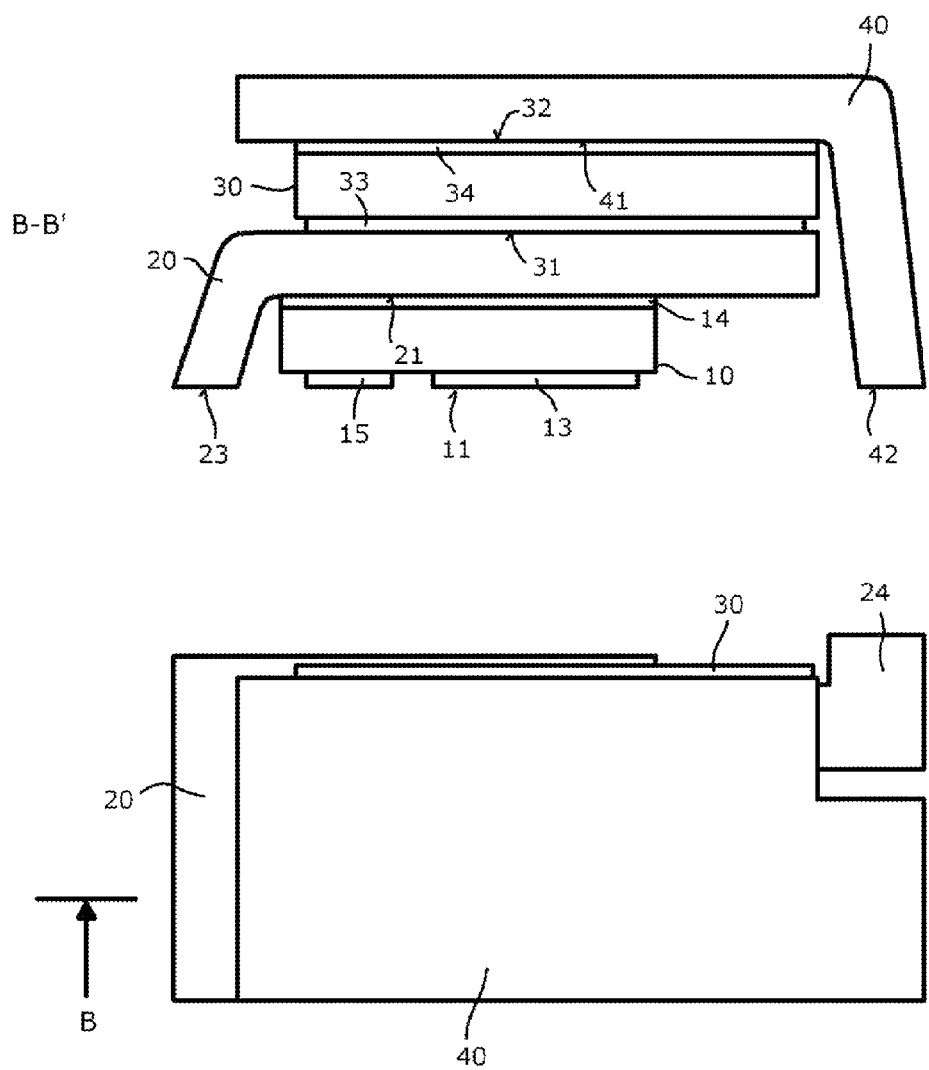
Figure 2E:
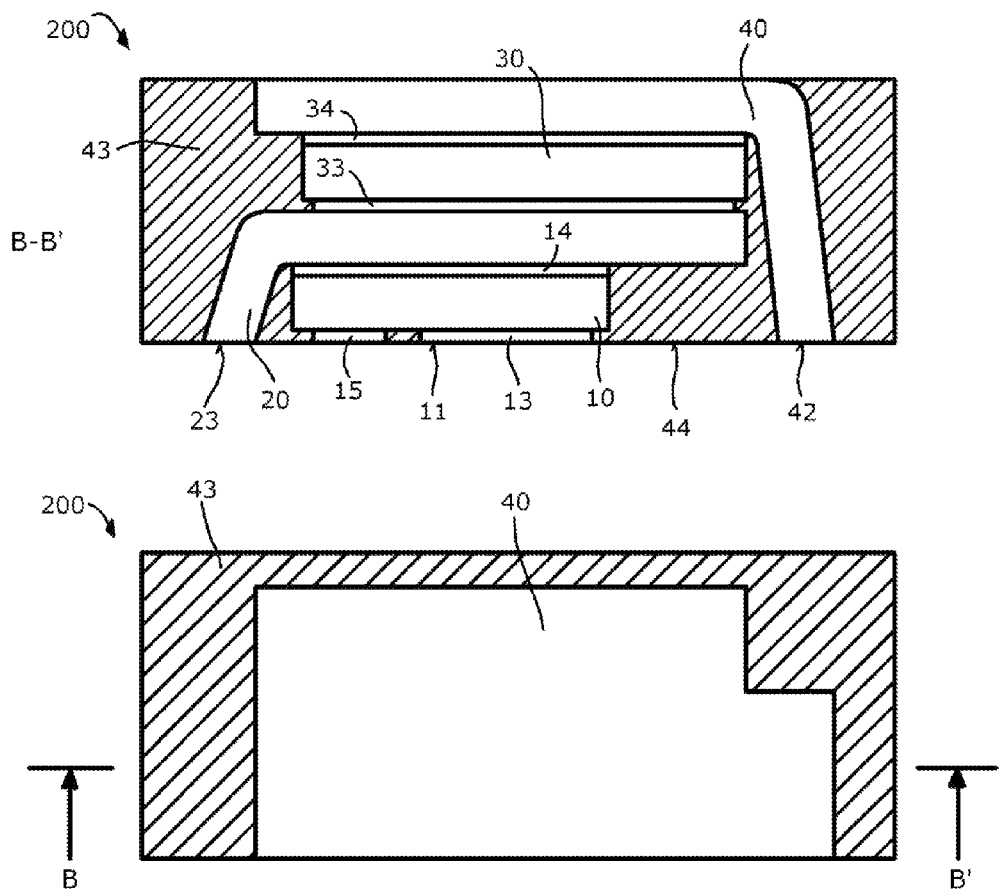

FIGS. 2A-2E, collectively FIG. 2, schematically illustrate an embodiment of a method of manufacturing a device 200, which is illustrated in FIG. 2E. The device 200 is an implementation of the device 100 shown in FIG. 1. The details of the device 200 that are described below can therefore be likewise applied to the device 100. Similar or identical components of the devices 100 and 200 are denoted by the same reference numerals.

FIG. 2A schematically illustrates a first power semiconductor chip 10 in a cross-sectional view (top) and a top plan view (bottom). The first power semiconductor chip 10 has a first face 11 and a second face 12 opposite to the first face 11. A first contact pad 13 is arranged on the first face 11, and a second contact pad 14 is arranged on the second face 12 of the first power semiconductor chip 10. The first and second contact pads 13, 14 are load electrodes. Furthermore, the first power semiconductor chip 10 has a third contact pad 15 on its first face 11. The third contact pad 15 is a control electrode.

The first power semiconductor chip 10 is configured as a power transistor, for example, a power MOSFET, IGBT, JFET or power bipolar transistor, or a power diode. In the case of a power MOSFET or a JFET, the first contact pad 13 is a source electrode, the second contact pad 14 is a drain electrode, and the third contact pad 15 is a gate electrode. In the case of an IGBT, the first contact pad 13 is an emitter electrode, the second contact pad 14 is a collector electrode, and the third contact pad 15 is a gate electrode. In the case of a power bipolar transistor, the first contact pad 13 is an emitter electrode, the second contact pad 14 is a collector electrode, and the third contact pad 15 is a base electrode. In the case of a power diode, the first and second contact pads 13, 14 are cathode and anode, and there is no third electrode. During operation, voltages higher than 5, 50, 100, 500 or 1000 V may be applied between the first and second contact pads 13, 14. The switching frequency applied to the third contact pad 15 may be in the range from 1 kHz to 100 MHz, but may also be outside this range.

The first power semiconductor chip 10 includes a semiconductor substrate 16 which is made of an appropriate semiconductor material, for example, Si, SiC, SiGe or GaAs, and contains n- and/or p-doped regions. Each of the contact pads 13, 14 and 15 consists of one or more metal layers applied to the semiconductor substrate 16. The metal layers may be manufactured with any desired geometric shape and any desired material composition. The metal layers may, for example, be in the form of a layer covering an area. Any desired metal or metal alloy, for example, aluminum, titanium, gold, silver, copper, palladium, platinum, nickel, chromium or nickel vanadium, may be used as the material. Each of the individual metal layers may have a specific function. The function of one of the metal layers is to make an electrical contact to the doped regions of the semiconductor substrate 16. Another one of the metal layers functions as a diffusion barrier which protects the semiconductor substrate 16 during a soldering process. A further function of one of the metal layers is that of an adhesion layer, which enables another metal layer to adhere to the semiconductor substrate 16. In one embodiment, the contact pads 13-15 consists of an aluminum layer with a thickness of 5 μm, a titanium layer with a thickness of 200 nm, a nickel layer with a thickness of 500 nm and a silver layer with a thickness of 200 nm.

In one embodiment, the second contact pad 14 covers the entire second face 12 of the first power semiconductor chip 10. A portion of the first face 11 of the power semiconductor chip 10 that does not form part of the first and the third contact pads 13, 15 may be covered by a passivation layer, which may be made of any appropriate dielectric material, for example, polyimide or silicon nitride.

FIG. 2B schematically illustrates contact clips 20 and 24 in a top plan view (bottom) and a cross-sectional view (top) along the line A-A' depicted in the top plan view. The contact clips 20, 24 are placed over the first power semiconductor chip 10. The contact clip 20 has contact areas 21, 22 at one end and a contact area 23 at the other end. The contact area 21 faces the second face 12 of the first power semiconductor chip 10. The contact clip 24 has a contact area 25 at one end and a contact area 26 at the other end. The shape of the contact clips 20, 24 is such that the contact areas 21, 22 and 25 are located on the side of the second face 12 of the first power semiconductor chip 10, whereas the contact areas 23, 26 are located on the side of the first face 11 of the first power semiconductor chip 10. A distance $d_1$ between a lower surface of the semiconductor substrate 16 and the contact areas 23, 26 may be in the range from 100 to 150 µm.

The contact clips 20, 24 are manufactured from a metal or a metal alloy, in particular, copper, copper alloys, iron nickel or other appropriate electrically conductive materials. The shapes of the contact clips 20, 24 are not limited to any size or geometric shape. The contact clips 20, 24 may have the shape as exemplarily illustrated in FIG. 2B, but any other shape is also possible, for example, an S-shape. The contact clips 20, 24 are fabricated by stamping, punching, pressing, cutting, sawing, milling or any other appropriate technique. In one embodiment, each of the contact clips 20, 24 is formed integrally, i.e., is made in one piece. In one embodiment, the contact clips 20, 24 are linked by dams (tie bars). The dams are removed later on during the processing. In one embodiment, further power semiconductor chips are provided and further contact clips are placed over the further power semiconductor chips. These power semiconductor chips and contact clips are not illustrated in FIG. 2B for reasons of clarity.

In one embodiment, the contact clip 20 is electrically and mechanically coupled to the first power semiconductor chip 10 by diffusion soldering. For that, a solder material is deposited on the second contact pad 14 or, alternatively, on the second contact pad 14 and the contact area 21 of the contact clip 20. In one embodiment, the solder material is deposited on the second contact pad 14 when the first power semiconductor chip 10 is still in the wafer bond, which means that the solder material is deposited on the semiconductor wafer before the semiconductor wafer is singulated in order to produce individual semiconductor chips. In one embodiment, the solder material consists of AuSn, AgSn, CuSn, Sn, AuIn, AgIn, AuSi or CuIn.

In one embodiment, both the first power semiconductor chip 10 and the contact clip 20 are placed in an oven and are heated to an appropriate temperature in order to melt the solder material. During the soldering process the contact clip 20 may be pressed onto the first power semiconductor chip 10 for an appropriate time. The solder material then produces a metallic joint between the contact clip 20 and the first power semiconductor chip 10 which is able to withstand high temperatures through the fact that the solder material forms a temperature-resistant and highly mechanically stable intermetallic phase with high-melting materials of the contact clip 20 and the first power semiconductor chip 10. The intermetallic phase has a higher melting temperature than the solder material used to generate the intermetallic phase. In the process, the low-melting solder material is completely transformed, i.e., it passes completely into the intermetallic phase.

In one embodiment, the contact clip 20 is electrically and mechanically coupled to the first power semiconductor chip 10 by soft soldering. In this case, SnPb, SnCuAg or SnAgSb may be used as the solder material. As an alternative to a solder material, an electrically conductive adhesive or a paste containing metal nano-particles is used to mount the contact clip 20 on the first power semiconductor chip 10. The electrically conductive adhesive may be based on epoxy resins and be enriched with gold, silver, nickel or copper in order to produce the electrical conductivity. The adhesive may be heated to a certain temperature to harden the adhesive. The metal nano-particles may, for example, be made of silver, gold, copper, tin or nickel. At least a fraction of the metal particles, for example, more than 20% or 30% or 40% or 50% or 60% or 70% or 80% of the metal particles, have diameters smaller than 100 nm or 50 nm or 10 nm. The metal nano-particles are heated to a temperature below the melting temperature of the metal they are made of. The temperature is, however, high enough to initiate a sintering process, thereby forming a sintered layer of the metal nano-particles between the contact clip 20 and the second contact pad 14 of the first power semiconductor chip 10.

FIG. 2C schematically illustrates a second power semiconductor chip 30 with a first face 31 and a second face 32 opposite to the first face 31. A first contact pad 33 is arranged on the first face 31 and a second contact pad 34 is arranged on the second face 32 of the second power semiconductor chip 30. The first and second contact pads 33, 34 are load electrodes. Furthermore, the second power semiconductor chip 30 has a third contact pad 35 on its first face 31. The third contact pad 35 is a control electrode. The second power semiconductor chip 30 is placed over the contact clips 20, 24 with its first contact pad 33 facing the contact area 22 of the contact clip 20 and its third contact pad 35 facing the contact area 25 of the contact clip 24. For electrically and mechanically coupling the second power semiconductor chip 30 to the contact clips 20, 24 one of diffusion soldering, soft soldering, an electrically conductive adhesive and a paste containing metal nano-particles is used as described above. The contact clip 20 electrically couples the first contact pad 33 of the second power semiconductor chip 30 to the second contact pad 14 of the first power semiconductor chip 10.

The second power semiconductor chip 30 is configured as a power transistor, for example, a power MOSFET, IGBT, JFET or power bipolar transistor, or a power diode. In the case of a power MOSFET or a JFET, the first contact pad 33 is a source electrode, the second contact pad 34 is a drain electrode, and the third contact pad 35 is a gate electrode. In the case of an IGBT, the first contact pad 33 is an emitter electrode, the second contact pad 34 is a collector electrode, and the third contact pad 35 is a gate electrode. In the case of a power bipolar transistor, the first contact pad 33 is an emitter electrode, the second contact pad 34 is a collector electrode, and the third contact pad 35 is a base electrode. In the case of a power diode, the first and second contact pads 33, 34 are cathode and anode, and there is no third electrode. During operation, voltages higher than 5, 50, 100, 500 or 1000 V may be applied between the first and second contact pads 33, 34. The switching frequency applied to the third contact pad 35 may be in the range from 1 kHz to 100 MHz, but may also be outside this range.

The second power semiconductor chip 30 includes a semiconductor substrate 36 which is made of an appropriate semiconductor material, for example, Si, SiC, SiGe, GaAs, and contains n- and/or p-doped regions. Each of the contact pads 33, 34 and 35 consists of one or more metal layers applied to the semiconductor substrate 36 of the second power semiconductor chip 30.

FIG. 2D schematically illustrates a contact clip 40 in a top plan view (bottom) and a cross-sectional view (top) along the line B-B' depicted in the top plan view. The contact clip 40 is placed over the second power semiconductor chip 30. The contact clip 40 has a contact area 41 at one end that faces the second face 32 of the second power semiconductor chip 30, and a contact area 42 at the other end. The shape of the contact clip 40 is such that the contact area 41 is located on the side of the second face 32 of the second power semiconductor chip 30, whereas the contact area 42 is located on the side of the first face 11 of the first power semiconductor chip 10.

The contact clip 40 is manufactured from a metal or a metal alloy, in particular, copper, copper alloys, iron nickel or other appropriate electrically conductive materials. The shape of the contact clip 40 is not limited to any size or geometric shape. The contact clip 40 may have the shape as exemplarily illustrated in FIG. 2D, but any other shape is also possible. The contact clip 40 is fabricated by stamping, punching, pressing, cutting, sawing, milling or any other appropriate technique. In one embodiment, the contact clip 40 is formed integrally, i.e., is made in one piece. For electrically and mechanically coupling the contact area 41 of the contact clip 40 to the second contact pad 34 of the second power semiconductor chip 30 one of diffusion soldering, soft soldering, an electrically conductive adhesive and a paste containing metal nano-particles is used as described above.

FIG. 2E schematically illustrates a mold material 43 that encapsulates the components of the device 200. The mold material 43 may encapsulate any portion of the device 200, but leaves, in one embodiment, the upper surface of the contact clip 40, the contact pads 13, 15 and the contact areas 23, 26 and 42 uncovered. In one embodiment, the mold material 43 also covers the top surface of the contact clip 40. In one embodiment, the mold material 43 is omitted.

The mold material 43 may be composed of any appropriate thermoplastic or thermosetting material, in particular, it may be composed of a material commonly used in contemporary semiconductor packaging technology. Various techniques may be employed to cover the components of the device 200 with the mold material 43, for example, compression molding, injection molding, powder molding or liquid molding.

The contact pads 13, 15 of the first power semiconductor chip 10, the contact area 23 of the contact clip 20, the contact area 26 of the contact clip 24 and the contact area 42 of the contact clip 40 are exposed from the mold material 43 at a surface 44 of the device 200 and serve as external contact elements of the device 200. The surface 44 is a mounting surface that serves to mount the device 200 onto another component, for example, a circuit board. The external contact elements 13, 15, 23, 26 and 42 are disposed on the mounting surface 44 and are accessible from outside the device 200 to allow to electrically couple the device 200 to the component on which the device 200 is mounted. In one embodiment, the contact areas 23, 26 and 42 form a common plane. In one embodiment, solder material is deposited on the contact pads 13, 15. In particular, solder material is also deposited on the contact areas 23, 26 and 42.

The device 200 does not contain any leadframe. Thus, the first power semiconductor chip 10 is not mounted on a leadframe or any other electrically conductive substrate. By contrast, the first face 11 of the first power semiconductor chip 10 including the contact pads 13, 15 is exposed and accessible from outside the device 200. Compared to devices including a leadframe, the device 200 has a smaller thickness. The omission of the leadframe also reduces the thermal and electrical resistance between the device 200 and the circuit board as the device is directly mounted on the circuit board which improves the thermal and electrical coupling between the device 200 and the circuit board. Further, there are no problems caused by different thermal expansion coefficients of the semiconductor material and the leadframe. In addition, stacking the components of the device 200, in particular, the power semiconductor chips 10, 30 on top of each other reduces the base area of the device 200.

Before or after the encapsulation with the mold material 43, the individual devices 200 are separated from one another by sawing or cutting the dams between the contact clips.

Figure 3A:
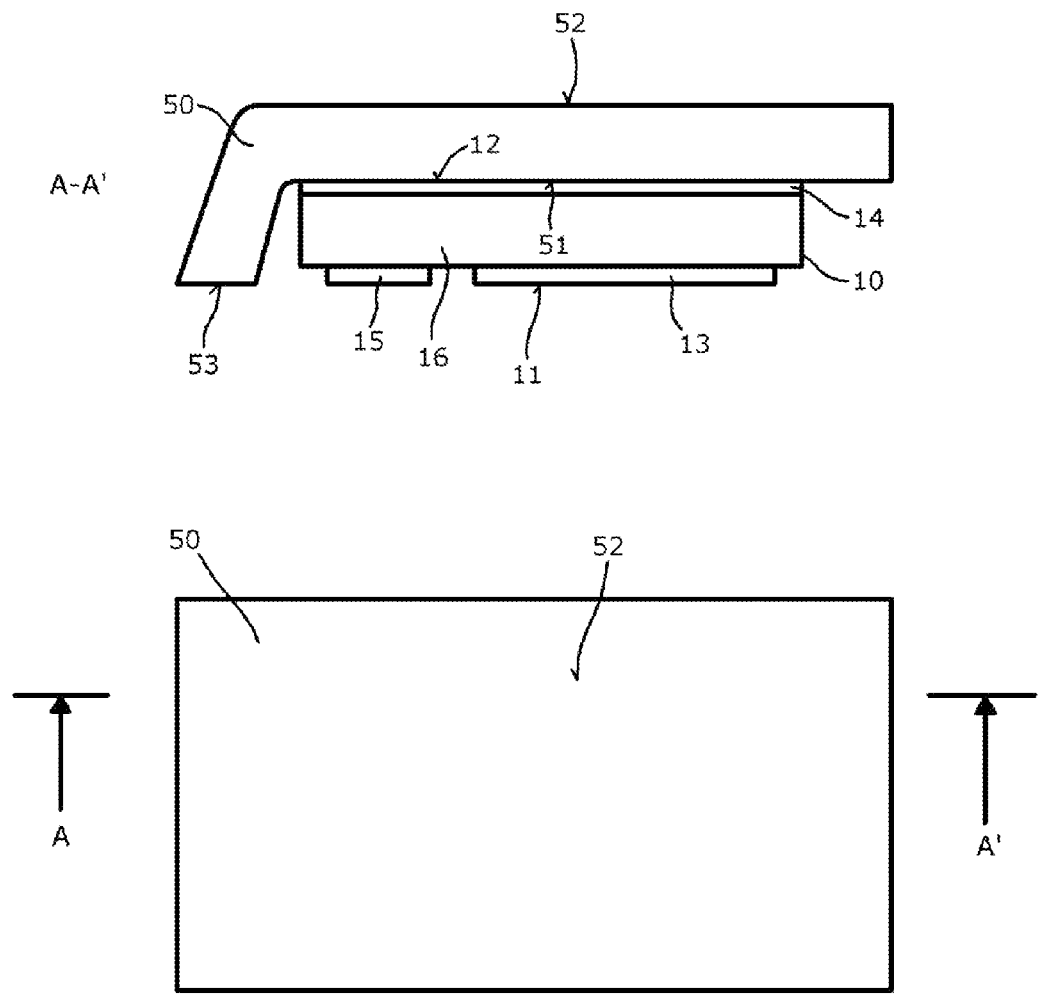
FIGS. 3A-3D schematically illustrate a cross-sectional and top plan view of one embodiment of a method including mounting two power semiconductor chips and two contact clips on top of each other, wherein one of the semiconductor chips has source and gate contact pads on one face and a drain contact pad on the other face and the other power semiconductor chip has drain and gate contact pads on one face and a source contact pad on the other face.
Figure 3B:
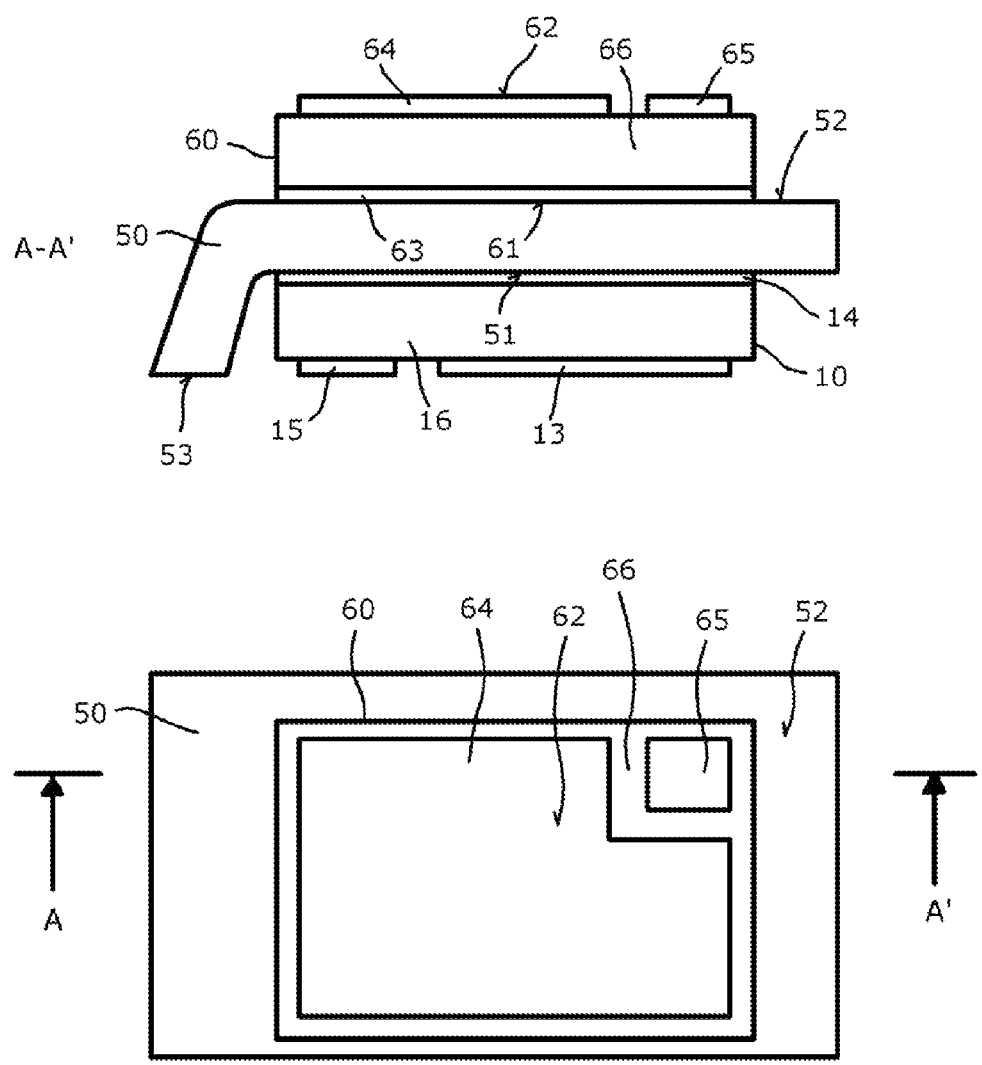
Figure 3C:
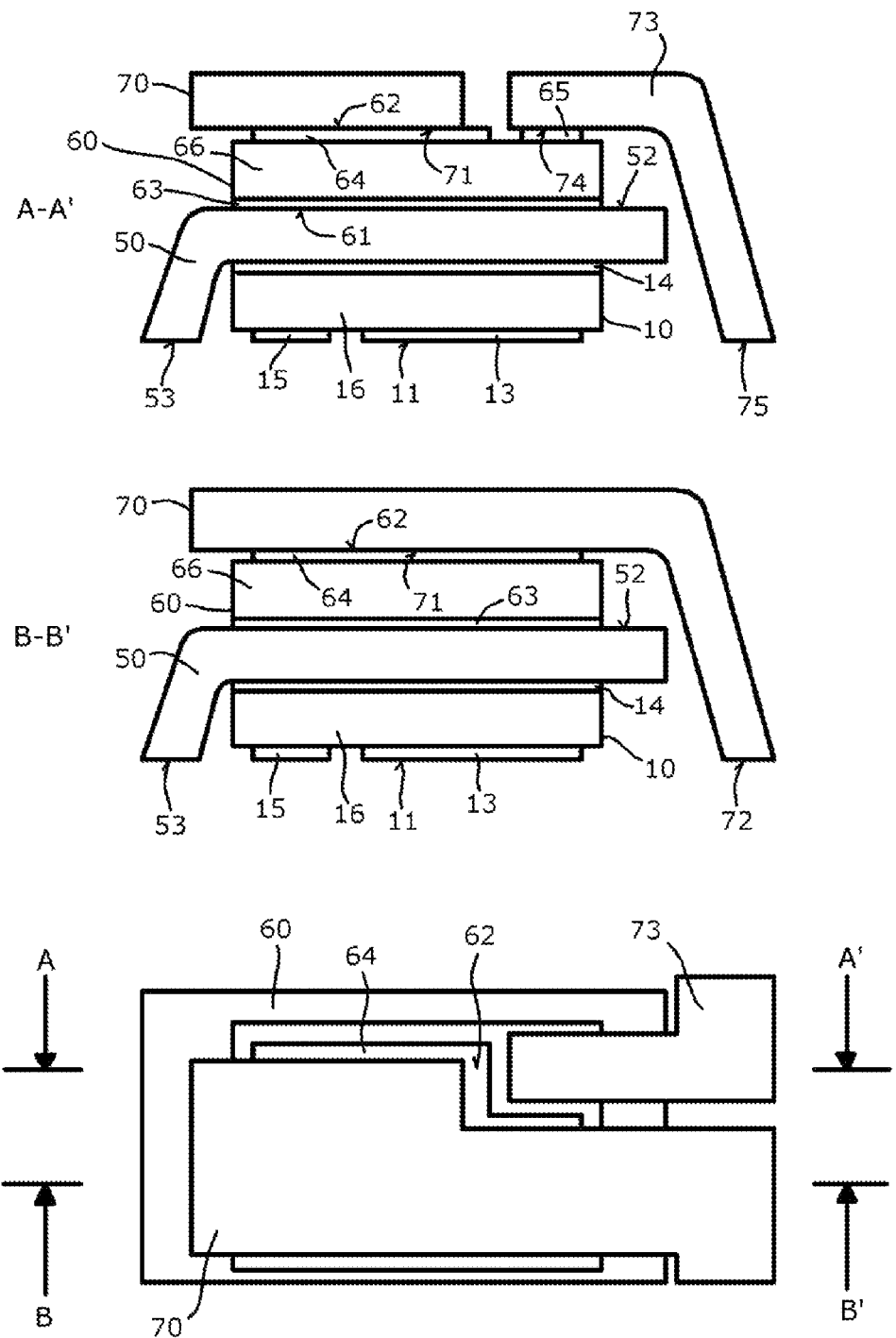
Figure 3D:
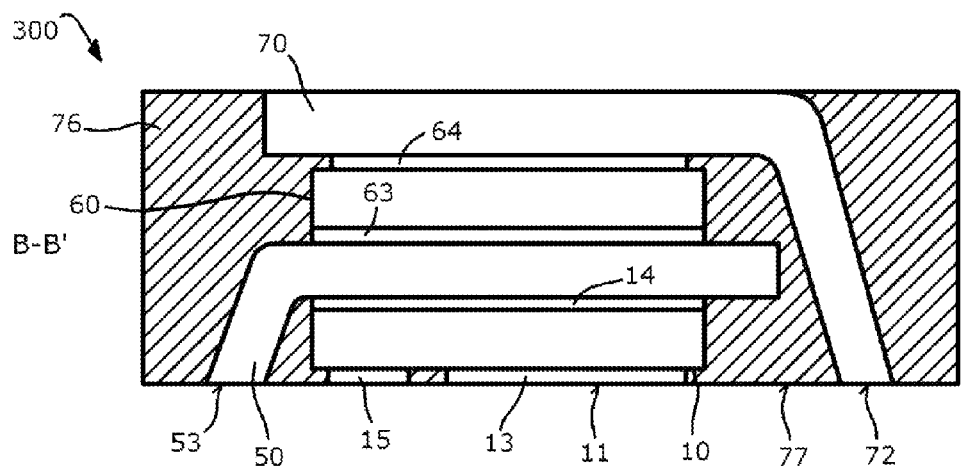
Figure 3D:
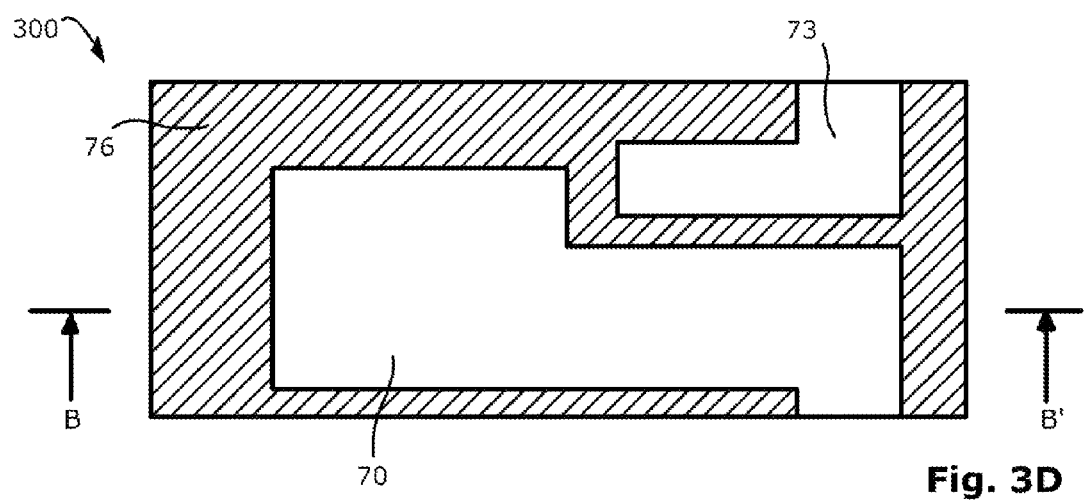

FIGS. 3A-3D, collectively FIG. 3, schematically illustrate a further method of manufacturing a device 300, which is illustrated in FIG. 3D.

FIG. 3A schematically illustrates a contact clip 50 in a top plan view (bottom) and a cross-sectional view (top) along the line A-A' depicted in the top plan view. The contact clip 50 is placed over the first power semiconductor chip 10 which is identical or at least similar to the first power semiconductor chip 10 described above in connection with FIG. 2. The contact clip 50 has contact areas 51, 52 at one end and a contact area 53 at the other end. The contact area 51 faces the second face 12 of the first power semiconductor chip 10. The shape of the contact clip 50 is such that the contact areas 51, 52 are located on the side of the second face 12 of the first power semiconductor chip 10, whereas the contact area 53 is located on the side of the first face 11 of the first power semiconductor chip 10.

The contact clip 50 is manufactured from a metal or a metal alloy, in particular, copper, copper alloys, iron nickel or other appropriate electrically conductive materials. The shape of the contact clip 50 is not limited to any size or geometric shape. The contact clip 50 may have the shape as exemplarily illustrated in FIG. 3A, but any other shape is also possible, for example, an S-shape. The contact clip 50 is fabricated by stamping, punching, pressing, cutting, sawing, milling or any other appropriate technique. In one embodiment, the contact clip 50 is formed integrally, i.e., is made in one piece. For electrically and mechanically coupling the contact area 51 of the contact clip 50 to the second contact pad 14 of the first power semiconductor chip 10 one of diffusion soldering, soft soldering, an electrically conductive adhesive and a paste containing metal nano-particles is used as described above.

FIG. 3B schematically illustrates a second power semiconductor chip 60 with a first face 61 and a second face 62 opposite to the first face 61. A first contact pad 63 is arranged on the first face 61 and a second contact pad 64 is arranged on the second face 62 of the second power semiconductor chip 60. The first and second contact pads 63, 64 are load electrodes. Furthermore, the second power semiconductor chip 60 has a third contact pad 65. In contrast to the second power semiconductor chip 30 described above in connection with FIG. 2, the third contact pad 65 is located on the second face 62 of the second power semiconductor chip 60. The third contact pad 65 is a control electrode. The second power semiconductor chip 60 is placed over the contact clip 50 with its first contact pad 63 facing the contact area 52 of the contact clip 50. For electrically and mechanically coupling the second power semiconductor chip 60 to the contact clip 50 one of diffusion soldering, soft soldering, an electrically conductive adhesive and a paste containing metal nano-particles is used as described above. The contact clip 50 electrically couples the first contact pad 63 of the second power semiconductor chip 60 to the second contact pad 14 of the first power semiconductor chip 10.

The second power semiconductor chip 60 is configured as a power transistor, for example, a power MOSFET, IGBT, JFET or power bipolar transistor, or a power diode. In the case of a power MOSFET or a JFET, the first contact pad 63 is a source electrode, the second contact pad 64 is a drain electrode, and the third contact pad 65 is a gate electrode. In the case of an IGBT, the first contact pad 63 is an emitter electrode, the second contact pad 64 is a collector electrode, and the third contact pad 65 is a gate electrode. In the case of a power bipolar transistor, the first contact pad 63 is an emitter electrode, the second contact pad 64 is a collector electrode, and the third contact pad 65 is a base electrode. In the case of a power diode, the first and second contact pads 63, 64 are cathode and anode, and there is no third electrode. During operation, voltages higher than 5, 50, 100, 500 or 1000 V may be applied between the first and second contact pads 63, 64. The switching frequency applied to the third contact pad 65 may be in the range from 1 kHz to 100 MHz, but may also be outside this range.

The second power semiconductor chip 60 includes a semiconductor substrate 66 which is made of an appropriate semiconductor material, for example, Si, SiC, SiGe, GaAs, and contains n- and/or p-doped regions. Each of the contact pads 63, 64 and 65 consists of one or more metal layers applied to the semiconductor substrate 66 of the second power semiconductor chip 60.

FIG. 3C schematically illustrates contact clips 70, 73 in a top plan view (bottom), a cross-sectional view (top) along the line A-A' depicted in the top plan view and a cross-sectional view (middle) along the line B-B' depicted in the top plan view. The contact clips 70, 73 are placed over the second power semiconductor chip 60. The contact clip 70 has a contact area 71 at one end that faces the second contact pad 64 of the second power semiconductor chip 60, and a contact area 72 at the other end. The contact clip 73 has a contact area 74 at one end that faces the third contact pad 65 of the second power semiconductor chip 60, and a contact area 75 at the other end. The shapes of the contact clips 70, 73 are such that the contact areas 71, 74 are located on the side of the second face 62 of the second power semiconductor chip 60, whereas the contact areas 72, 75 are located on the side of the first face 11 of the first power semiconductor chip 10.

The contact clips 70, 73 are manufactured from a metal or a metal alloy, in particular, copper, copper alloys, iron nickel or other appropriate electrically conductive materials. The shapes of the contact clips 70, 73 are not limited to any size or geometric shape. The contact clips 70, 73 may have the shape as exemplarily illustrated in FIG. 3C, but any other shapes are also possible, for example, an S-shape. The contact clips 70, 73 are fabricated by stamping, punching, pressing, cutting, sawing, milling or any other appropriate technique. In one embodiment, each of the contact clips 70, 73 is formed integrally, i.e., is made in one piece. For electrically and mechanically coupling the contact area 71 of the contact clip 70 to the second contact pad 64 of the second power semiconductor chip 60 and the contact area 74 of the contact clip 73 to the third contact pad 65 of the second power semiconductor chip 60 one of diffusion soldering, soft soldering, an electrically conductive adhesive and a paste containing metal nano-particles is used as described above.

FIG. 3D schematically illustrates a mold material 76 that encapsulates the components of the device 300. The mold material 76 may encapsulate any portion of the device 300, but leaves, in one embodiment, the top surfaces of the contact clips 70, 73, the contact pads 13, 15 and the contact areas 53, 72 and 75 uncovered. In one embodiment, the mold material 76 also covers the top surfaces of the contact clips 70, 73. In one embodiment, the mold material 76 is omitted.

The mold material 76 may be composed of any appropriate thermoplastic or thermosetting material, in particular, it may be composed of a material commonly used in contemporary semiconductor packaging technology. Various techniques may be employed to cover the components of the device 300 with the mold material 76, for example, compression molding, injection molding, powder molding or liquid molding.

The contact pads 13, 15 of the first power semiconductor chip 10, the contact area 53 of the contact clip 50, the contact area 72 of the contact clip 70 and the contact area 75 of the contact clip 73 are exposed from the mold material 76 at a surface 77 of the device 300 and serve as external contact elements of the device 300. The surface 77 is a mounting surface that serves to mount the device 300 onto another component, for example, a circuit board. The external contact elements 13, 15, 53, 72 and 75 are disposed on the mounting surface 77 and are accessible from outside the device 300 to allow to electrically couple the device 300 to the component on which the device 300 is mounted. In one embodiment, the contact areas 53, 72 and 75 form a common plane. In one embodiment, solder material is deposited on the contact pads 13, 15. In particular, solder material is also deposited on the contact areas 53, 72 and 75. The device 300 does not contain any leadframe on which the first power semiconductor chip 10 is mounted.

Figure 4:
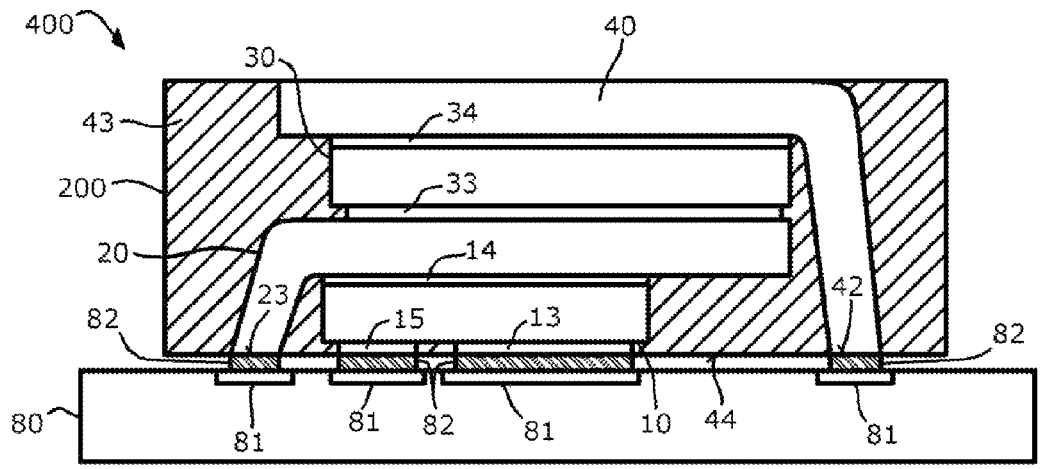
FIG. 4 schematically illustrates a cross-sectional view of one embodiment of a system including the device illustrated in FIG. 2E mounted on a circuit board.
Figure 5:
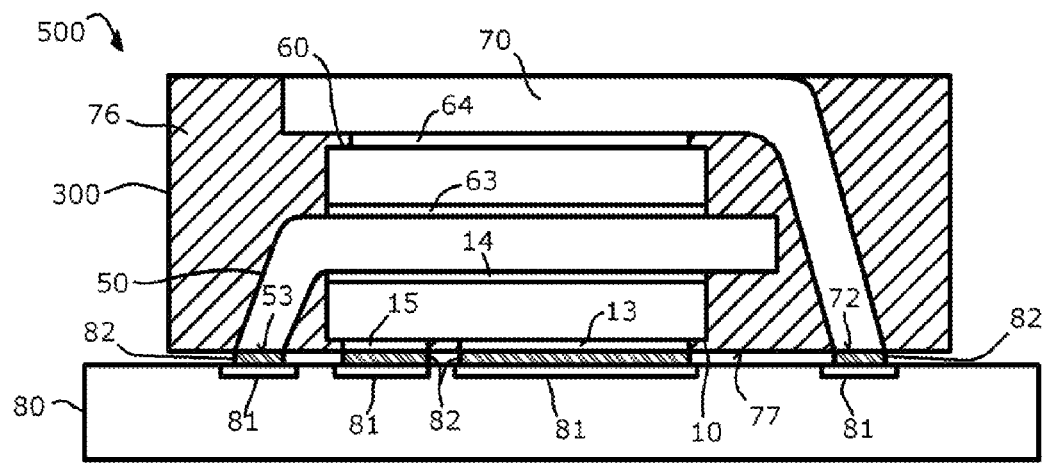
FIG. 5 schematically illustrates a cross-sectional view of one embodiment of a system including the device illustrated in FIG. 3D mounted on a circuit board.

FIGS. 4 and 5 schematically illustrate cross-sectional views of systems 400 and 500 including the devices 200 and 300 mounted on a circuit board 80, respectively. The circuit board 80 is a PCB and includes contact pads 81. The devices 200 and 300 are mounted on the circuit board 80 with their mounting surfaces 44 and 77 facing the circuit board 80, respectively. The external contact elements 13, 15, 23, 26 and 42 of the device 200 and the external contact surfaces 13, 15, 53, 72 and 75 of the device 300 are attached to the contact pads 81 of the circuit board 80 using solder deposits 82. In one embodiment, heat sinks are attached to the top surfaces of the devices 200 and 300.

Figure 6:
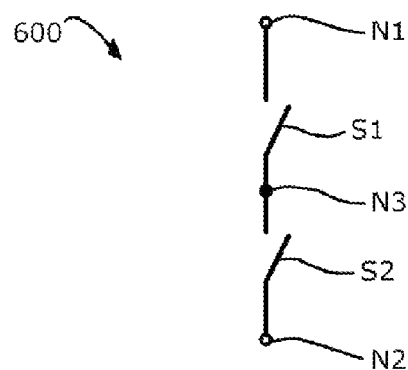
FIG. 6 shows a basic circuit of a half-bridge circuit.

FIG. 6 shows a basic circuit 600 of a half-bridge circuit arranged between two nodes N1 and N2. The half-bridge circuit consists of two switches S1 and S2 connected in series. The power semiconductor chips 10 and 30 of the device 200 and the power semiconductor chips 10 and 60 of the device 300 may be implemented as the switches S1 and S2, respectively. Constant electrical potentials may be applied to the nodes N1 and N2. For example, a high potential, such as 10, 50, 100, 200, 500 or 1000 V or any other potential, may be applied to the node N1 and a low electrical potential, for example 0V, may be applied to the node N2. The switches S1 and S2 may be switched at frequencies in the range from 1 kHz to 100 MHz, but the switching frequencies may also be outside this range. This means that a varying electrical potential is applied to a node N3 arranged between the switches S1 and S2 during operation of the half-bridge. The potential of the node N3 varies in the range between the low and the high electrical potential.

The half-bridge circuit may, for example, be implemented in electronic circuits for converting DC voltages, so-called DC-DC converters. DC-DC converters may be used to convert a DC input voltage provided by a battery or a rechargeable battery into a DC output voltage matched to the demand of electronic circuits connected downstream. DC-DC converters may be embodied as step-down converters, in which the output voltage is less than the input voltage, or as step-up converters, in which the output voltage is greater than the input voltage. Frequencies of several MHz or higher may be applied to DC-DC converters. Furthermore, currents of up to 50 A or even higher may flow through the DC-DC converters.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method, comprising:
    providing a first power semiconductor chip having a first face and a second face opposite to the first face with a first contact pad arranged on the first face, wherein the first face of the first power semiconductor chip is a mounting surface;
    attaching a first integrally formed contact clip to the second face of the first power semiconductor chip, wherein the first contact clip is linked to a coplanarily arranged third integrally formed contact clip by removable tie bars;
    attaching a second power semiconductor chip to the first contact clip, wherein the second power semiconductor chip has a first face and a second face opposite to the first face with a first contact pad and a third contact pad arranged on the first face and a second contact pad arranged on the second face;
    attaching the third contact clip to the third contact pad of the second power semiconductor chip;
    attaching a second integrally formed contact clip to the second contact pad of the second power semiconductor chip;
    removing the tie bars linking the first and third contact clips; and
    after removing the tie bars, mounting the first power semiconductor chip to a circuit board with the mounting surface facing the circuit board.

2. The method of claim 1, wherein attaching the first contact clip to the second face of the first power semiconductor chip comprises one of diffusion soldering, soft soldering, gluing or sintering.

3. The method of claim 1, wherein contact areas of the first contact clip and the second contact clip are exposed at the mounting surface.

4. The method of claim 1, wherein a contact area of the third contact clip is exposed at the mounting surface.

5. The method of claim 1, wherein mounting the first power semiconductor chip to the circuit board comprises soldering the first contact pad of the first power semiconductor chip to the circuit board.

* * * * *